(12) United States Patent
Kamahori

(10) Patent No.: US 7,564,252 B2
(45) Date of Patent: Jul. 21, 2009

(54) SEMICONDUCTOR INSPECTION APPARATUS

(75) Inventor: Hideo Kamahori, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/054,468

(22) Filed: Mar. 25, 2008

(65) Prior Publication Data

US 2008/0238456 A1 Oct. 2, 2008

(30) Foreign Application Priority Data

Mar. 29, 2007 (JP) ............................. 2007-086411

(51) Int. Cl.
*G01R 31/02* (2006.01)
*G01R 31/26* (2006.01)
(52) U.S. Cl. ..................... 324/754; 324/715; 324/756; 324/761
(58) Field of Classification Search ......... 324/754–765, 324/715–718
See application file for complete search history.

(56) References Cited

U.S. PATENT DOCUMENTS 7,307,434 B2 *  12/2007  Watanabe ................... 324/754
2005/0162177 A1 *  7/2005  Chou ......................... 324/754

FOREIGN PATENT DOCUMENTS

| JP | 62-109334 | 5/1987 |
|----|-----------|--------|
| JP | 05-144895 | 6/1993 |
| JP | 09-203764 | 8/1997 |

* cited by examiner

*Primary Examiner*—Ha Tran T Nguyen
*Assistant Examiner*—Emily Y Chan
(74) *Attorney, Agent, or Firm*—Young & Thompson

(57) ABSTRACT

A semiconductor inspection apparatus includes a force probe applying voltage to a semiconductor device, and a sense probe detecting voltage of the semiconductor device, in which the force probe is contacted with an electrode pad of the semiconductor device and the force probe and the sense probe are contacted with each other to measure electric characteristics of the semiconductor device, and the force probe and the sense probe are arranged substantially on the same line when seen from a vertical direction with respect to an electrode surface (principal surface) of the semiconductor device.

15 Claims, 3 Drawing Sheets

US 7,564,252 B2

SEMICONDUCTOR INSPECTION APPARATUS

BACKGROUND OF THE INVENTION

1. Field of the Invention

The present invention relates to a semiconductor inspection apparatus performing an inspection of a semiconductor device.

2. Description of Related Art

In a typical semiconductor inspection apparatus performing inspection of a semiconductor device by measuring electric characteristics of the semiconductor device, a probe is contacted with an electrode pad on the semiconductor device to measure the electric characteristics of the semiconductor device.

Be—Cu material or W material is normally used as a material of the probe. Be—Cu material has small resistance value and great measurement accuracy while it has poor durability. On the other hand, W material has great durability while it has poor measurement accuracy due to its large resistance value. Therefore, it is necessary to perform Kelvin measurement having better measurement accuracy when electric characteristics of the semiconductor device are measured by the probe with W material. In Kelvin measurement, a force probe and a sense probe are contacted with the electrode pad to measure electric characteristics. The force probe applies voltage to the semiconductor device and the sense probe detects voltage of the semiconductor device.

Semiconductor devices have been highly integrated and semiconductor packages have been miniaturized these days, which means size of the electrode pad and the electrode pitch have been reduced. On the other hand, the area of the electrode pad or the pitch between electrodes is needed to be large enough to bring the probe into contact with the electrode pad with high accuracy. It is difficult in the conventional technique to arrange the probes at narrow pitches in a vicinity of the device. Therefore, it has been more and more difficult to bring the electrode pad of the highly integrated and miniaturized semiconductor device into contact with the probe with high accuracy.

For example, Japanese Unexamined Patent Application Publication No. 62-109334 discloses a technique bringing a first probe into contact with an electrode pad and bringing a second probe into contact with an upper portion of the first probe to perform Kelvin measurement. Hence, it is possible to bring miniaturized electrode pad into contact with the probe.

Further, Japanese Unexamined Patent Application Publication No. 5-144895 discloses a technique bringing a probe 50 to which tips of the sense probe and the force probe are Kelvin connected into contact with an electrode pad 51 to perform Kelvin measurement, as shown in FIG. 3.

Further, Japanese Unexamined Patent Application Publication No. 9-203764 discloses a technique binding a lead 60 of a semiconductor device 61 by a force probe 62 and a sense probe 63 to perform Kelvin measurement, as shown in FIG. 4.

However, in the Japanese Unexamined Patent Application Publication No. 62-109334, the second probe is arranged in an oblique position with respect to the first probe (see for example FIG. 3B of Japanese Unexamined Patent Application Publication No. 62-109334). Therefore, the space occupied by two probes becomes so large that the probes cannot be arranged at narrow pitches with respect to a highly-integrated semiconductor device. In the same way, in Japanese Unexamined Patent Application Publication No. 5-144895, the probe 50 is divided into two parts, which makes it impossible to arrange the probes 50 at narrow pitches with respect to the semiconductor device.

In Japanese Unexamined Patent Application Publication No. 62-109334, the first probe and the second probe are sharply formed, which makes it difficult to contact two probes with each other with high accuracy.

SUMMARY

According to a first aspect of the present invention, there is provided a semiconductor inspection apparatus including a force probe and a sense probe arranged substantially on the same line when seen from a vertical direction with respect to an electrode surface of a semiconductor device. By having such a configuration, space occupied by the probes can be reduced. Hence, it is possible to arrange the probes at narrow pitches with respect to the highly-integrated semiconductor device.

According to a second aspect of the present invention, there is provided a semiconductor inspection apparatus having an end portion of a force probe contacted with an electrode and made in a flat shape. Then an end portion of the sense probe is contacted with the end portion of the force probe so that the sense probe is contacted with the force probe. By having such a configuration, it is possible to bring the sense probe into contact with the force probe when the end portion of the sense probe is contacted with any part of the end portion that is formed in a flat surface of the force probe. Therefore, it is possible to contact the probes with high accuracy.

Further, according to a third aspect of the present invention, there is provided a semiconductor inspection apparatus having an end port ion of a force probe connected with an electrode and sharply formed. The force probe includes a flat portion in the end portion side of the force probe. The sense probe has an end portion contacted with the flat portion of the force probe so that the sense probe is contacted with the force probe. By having such a configuration, point contact is made between the electrode and the force probe. Therefore, it is possible to prevent displacement that may be occurred in contacting the electrode with the force probe. It is possible to bring the sense probe into contact with the force probe when the end portion of the sense probe is contacted with any part of a flat surface of the force probe. Therefore, it is possible to contact the probes with high accuracy.

According to the present invention, it is possible to arrange the probes at narrow pitches with respect to the highly-integrated semiconductor device. Further, it is possible to bring the force probe into contact with the sense probe with high accuracy.

BRIEF DESCRIPTION OF THE DRAWINGS

The above and other objects, advantages and features of the present invention will be more apparent from the following description of certain preferred embodiments taken in conjunction with the drawings, in which.

DETAILED DESCRIPTION OF THE PREFERRED EMBODIMENTS

The invention will now be described herein with reference to illustrative embodiments. Those skilled in the art will recognized that many alternative embodiments can be accomplished using the teachings of the present invention and that the invention is not limited to the embodiments illustrated for explanatory purposes.

First Embodiment

Figure 1:
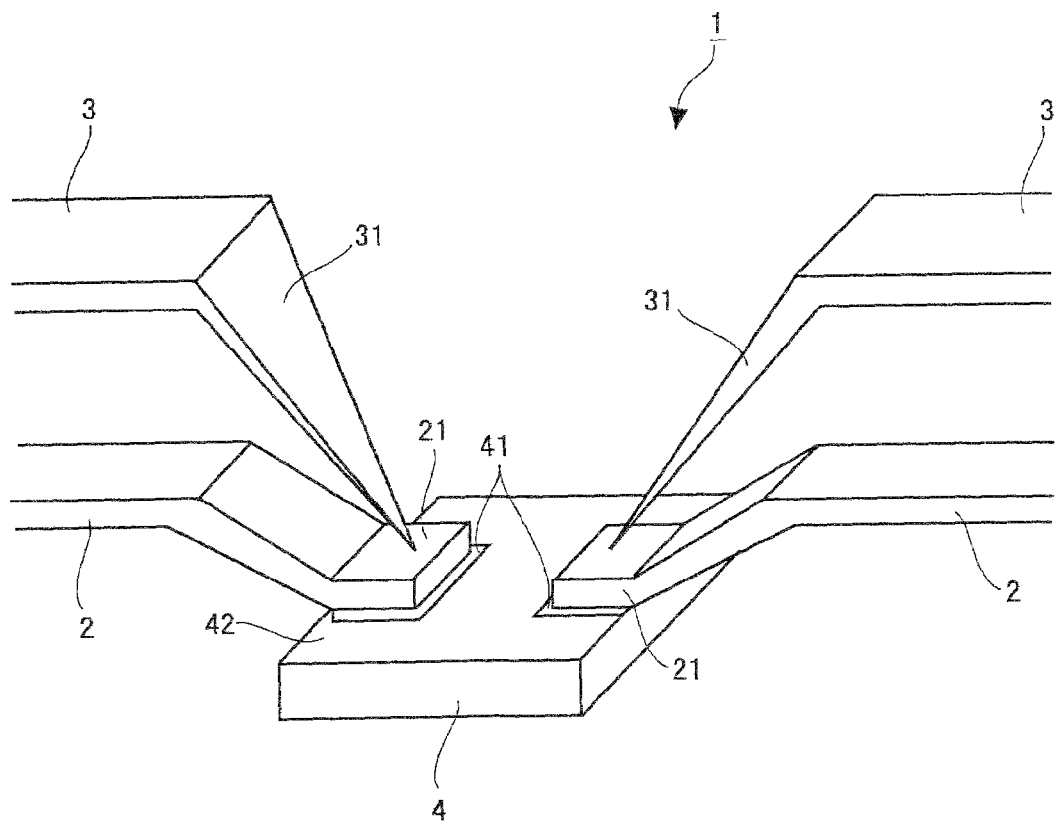
FIG. 1 is a perspective view schematically showing a semiconductor inspection apparatus according to a first embodiment of the present invention.

A semiconductor inspection apparatus 1 according to the first embodiment will now be described with reference to FIG. 1. FIG. 1 is a perspective view schematically showing the semiconductor inspection apparatus 1 according to the first embodiment of the present invention.

The semiconductor inspection apparatus 1 includes a force probe 2, a sense probe 3, a power supply unit (not shown) and so on, for example, as shown in FIG. 1. The semiconductor inspection apparatus 1 may be a semiconductor sorting apparatus sorting defective units, for example.

Further, as shown in FIG. 1, there are provided a plurality of electrode pads 41 on the semiconductor device 4. The electrode pad 41 has substantially a rectangular shape. The electrode pad 41 functions as the electrode on the semiconductor device 4. Note that the shape of the electrode pad 41 is not limited to the rectangular shape but can be formed in a preferable shape.

The force probe 2 is contacted with the electrode pad 41 to apply voltage to the semiconductor device 4. More specifically, the force probe 2 has an end portion 21 contacted with the electrode pad 41 and formed in flat plate shape, for example. Then a lower surface of the end portion 21 of the force probe 2 is contacted with the electrode pad 41. More specifically, the end portion 21 of the force probe 2 is formed to have substantially the same shape to the electrode pad 41 when seen in a plan view, for example. The force probe 2 extends in an oblique upward direction from the end portion 21, and bends at an appropriate area so that the force probe 2 becomes substantially parallel to a principal surface 42 of the semiconductor device 4.

The sense probe 3 has an end portion 31 formed in a triangular shape so that the end portion 31 of the sense probe 3 is sharpened. The end portion 31 extends in an oblique upward direction, and the angle with the principal surface 42 of the semiconductor device 4 is larger than the oblique surface of the force probe 2. The sense probe 3 bends to be substantially parallel to the principal surface 42 of the semiconductor device 4 from the end portion 31 and the sense probe 3 extends in a lateral direction of the semiconductor device 4. Then the end portion 31 of the sense probe 3 is contacted with any part (central part in this example) of the upper surface of the end portion 21 of the force probe 2 so that the sense probe 3 and the force probe 2 are contacted with each other.

Further, the force probe 2 and the sense probe 3 are formed by thin linear member. For example, the force probe 2 and the sense probe 3 are formed by Be—Cu material or W material. It is possible to form the force probe 2 and the sense probe 3 having great measuring accuracy by forming the probes by Be—Cu material, for example. On the other hand, it is possible to form the force probe 2 and the sense probe 3 having greater durability by forming the probes by W material, for example.

Then voltage is applied to the semiconductor device 4 by the force probe 2 contacted with the electrode pad 41. Voltage of the semiconductor device 4 is measured by the sense probe 3 contacted with the end portion 21 of the force probe 2. Hence, electric characteristics of the semiconductor device 4 can be measured by the semiconductor inspection apparatus 1.

Further, the force probe 2 and the sense probe 3 are arranged to be substantially on the same line when seen from a vertical direction with respect to the principal surface 42 of the semiconductor device 4 (an electrode surface having the electrode pad 41 arranged thereon), for example.

As described above, in the semiconductor inspection apparatus 1 according to the first embodiment of the present invention, the force probe 2 and the sense probe 3 are arranged substantially on the same line when seen from the vertical direction with respect to the electrode surface of the semiconductor device 4. By having such a configuration, it is possible to reduce the space occupied by the probes. Therefore, it is possible to arrange the probes at narrow pitches with respect to the highly-integrated semiconductor device 4.

The end portion 21 of the force probe 2 contacted with the electrode pad 41 is formed in a flat shape. The end portion 31 of the sense probe 3 is contacted with the end portion 21 of the force probe 2 so that the sense probe 3 is contacted with the force probe 2. By having such a configuration, it is possible to bring the force probe 2 into contact with the sense probe 3 when the end portion 31 of the sense probe 3 is contacted with any part of the flat surface of the end portion 21 of the force probe 2. Therefore, it is possible to contact two probes with high accuracy.

Second Embodiment

Figure 2:
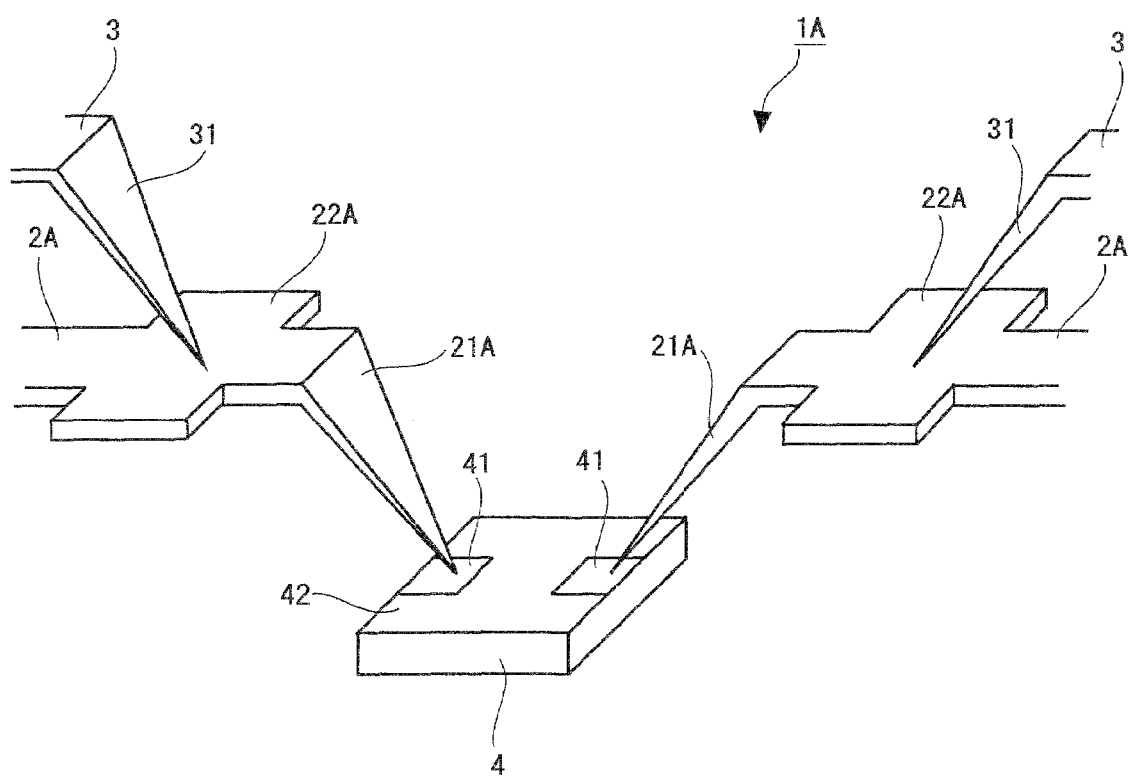
FIG. 2 is a perspective view schematically showing the semiconductor inspection apparatus according to a second embodiment of the present invention.
Figure 3:
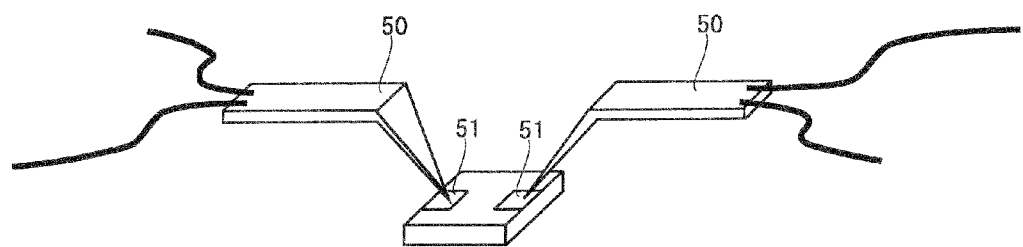
FIG. 3 is a perspective view schematically showing a related semiconductor inspection apparatus.
Figure 4:
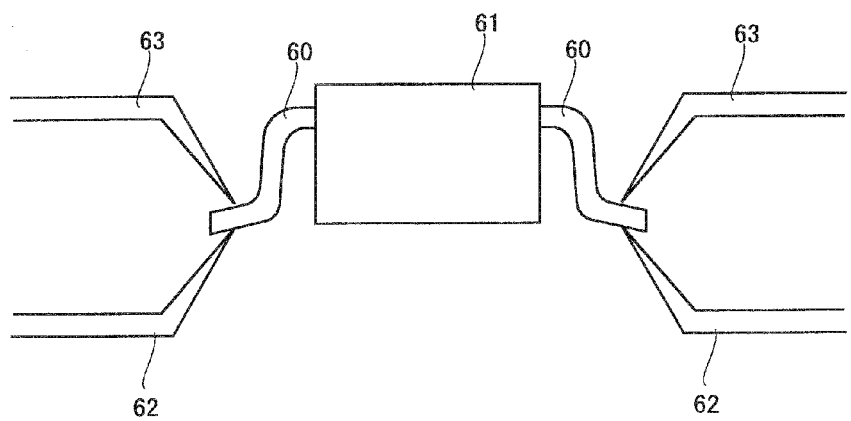
FIG. 4 is a perspective view schematically showing another related semiconductor inspection apparatus.

A semiconductor inspection apparatus 1A according to the second embodiment of the present invention will now be described with reference to FIG. 2. FIG. 2 is a perspective view schematically showing the semiconductor inspection apparatus 1A according to the second embodiment of the present invention.

The configurations of the sense probe 3 and the semiconductor device 4 according to the second embodiment are the same as the configurations shown in FIG. 1. Therefore, the same reference symbols are given to the same components and the overlapping description will be omitted here.

The semiconductor inspection apparatus 1A includes a force probe 2A, a sense probe 3, and a power supply unit (not shown) and so on, for example, as shown in FIG. 2.

The force probe 2A is contacted with the electrode pad 41 to apply voltage to the semiconductor device 4. More specifically, the force probe 2A has an end portion 21A formed in the triangular shape so that the end portion 21A of the force probe 2A contacted with the electrode pad 41 is sharpened. The force probe 2A includes a flat portion 22A in the end portion 21A side of the force probe 2A, for example. The flat portion 22A has rectangular shape whose width is larger than the end portion 21A, for example. Therefore, the flat portion 22A has a shape extruded in both sides with respect to width direction of the force probe 2A. Further, the end portion 21A extends in oblique upward direction with respect to the principal surface 42 of the semiconductor device 4, and the flat portion 22A bends to be substantially parallel to the principal surface 42 of the semiconductor device 4 from the end portion 21A. Then the end portion 31 of the sense probe 3 is contacted to any part (central part in this example) of the upper surface of the flat portion 22A so that the force probe 2A and the sense probe 3 are contacted with each other.

The flat portion 22A is preferably arranged in a position closer to the end portion 21A of the force probe 2A in order to prevent accuracy degrading of the voltage detection of the semiconductor device 4, for example. Further, the flat portion 22A is preferably formed in a size so as not to prevent the arrangement of the probes with respect to the highly-integrated semiconductor device 4.

The end portion 31 of the sense probe 3 is formed in the triangular shape so that the end portion 31 is sharpened, for example. The end portion 31 extends in the oblique upward direction, and the end portion 31 and the end portion 21A of the force probe 2A are substantially parallel to each other. Then the end portion 31 of the sense probe 3 is contacted with the flat portion 22A of the force probe 2A so that the sense probe 3 and the force probe 2A are contacted with each other, for example.

Further, the force probe 2A and the sense probe 3 are formed by thin linear member. For example, the force probe 2A and the sense probe 3 are formed by Be—Cu material or W material. It is possible to form the force probe 2A and the sense probe 3 having great measuring accuracy by forming the probes by Be—Cu material, for example. On the other hand, it is possible to form the force probe 2A and the sense probe 3 having greater durability by forming the probes by W material, for example.

Then voltage is applied to the semiconductor device 4 by the force probe 2A contacted with the electrode pad 41. Voltage of the semiconductor device 4 is measured by the sense probe 3 contacted with the flat portion 22A of the force probe 2A. Hence, electric characteristics of the semiconductor device 4 can be measured by the semiconductor inspection apparatus 1A.

Further, the force probe 2A and the sense probe 3 are arranged to be substantially on the same line when seen from the vertical direction with respect to the principal surface 42 of the semiconductor device 4 (the electrode surface having the electrode pad 41 arranged thereon), for example.

As described above, in the semiconductor inspection apparatus 1A according to the second embodiment of the present invention, the force probe 2A and the sense probe 3 are arranged substantially on the same line when seen from the vertical direction with respect to the electrode surface of the semiconductor device 4. By having such a configuration, it is possible to reduce the space occupied by the probes. Therefore, it is possible to arrange the probes at narrow pitches with respect to the highly-integrated semiconductor device 4.

Further, the end portion 21A of the force probe 2A contacted with the electrode pad 41 is sharply formed. The force probe 2A includes the flat portion 22A in the end portion 21A side of the force probe 2A. Then the end portion 31 of the sense probe 3 is contacted with the flat portion 22A of the force probe 2A so that the sense probe 3 is contacted with the force probe 2A. By having such a configuration, point contact is made between the electrode pad 41 and the force probe 2A. Hence, it is possible to prevent displacement that may be occurred in bringing the electrode pad 41 into contact with the force probe 2A. Further, the sense probe 3 and the force probe 2A can be contacted with each other when the end portion 31 of the sense probe 3 is contacted with any part of the flat portion 22A of the force probe 2A. Therefore, it is possible to contact two probes with high accuracy.

Although the end portion 21 of the force probe 2 is formed to be substantially the same shape as that of the electrode pad 41 in the plan view in the first embodiment of the present invention, the shape of the end portion 21 is not limited to it.

The shape of the end portion 21 of the force probe 2 can be any so long as the end portion is formed in a flat shape having substantially the same size as the electrode pad 41.

In the embodiment of the present invention, the force probes 2, 2A and the sense probe 3 are arranged substantially on the same line when seen from the vertical direction with respect to the electrode surface of the semiconductor device 4. However, the arrangement is not limited to it. The probes can be arranged in a preferable position with respect to the semiconductor device 4.

It is apparent that the present invention is not limited to the above embodiment but it may be modified and changed without departing from the scope and spirit of the invention.

What is claimed is:

1. A semiconductor inspection apparatus comprising:
   a force probe applying voltage to a semiconductor device, the force probe having an end portion; and
   a sense probe detecting voltage of the semiconductor device, the sense probe having a distal end portion,
   wherein the force probe end portion is contacted with an electrode of the semiconductor device and an upper surface of the force probe is contacted by the distal end portion of the sense probe to measure electric characteristics of the semiconductor device, and
   the force probe and the sense probe are arranged substantially on the same line when seen from a vertical direction with respect to an electrode surface of the semiconductor device.

2. The semiconductor inspection apparatus according to claim 1, wherein,
   the force probe end portion is horizontal,
   the force probe extends in an oblique upward direction from the force probe end portion at a first angle with a principal surface of the semiconductor device, and bends at an area so that the force probe is substantially horizontal and parallel to the principal surface of the semiconductor device, and
   the sense probe end portion extends in an oblique upward direction with a second angle with the principal surface of the semiconductor device,
   the sense probe bending at an area so that the sense probe is substantially parallel to the principal surface of the semiconductor device from the sense probe end portion and the sense probe extends in a lateral direction of the semiconductor device, and
   the sense probe extends vertically over the force probe.

3. The semiconductor inspection apparatus according to claim 2, wherein,
   the sense probe end portion has a sharpened shape, the sharpened shape being in contact with the upper surface of the force probe.

4. The semiconductor inspection apparatus according to claim 1, wherein,
   the force probe and the sense probe are formed by a W material.

5. The semiconductor inspection apparatus according to claim 1, wherein,
   the force probe and the sense probe are formed by a Be—Cu material.

6. The semiconductor inspection apparatus according to claim 1, wherein,
   the force probe and the sense probe are formed by a Be—Cu material.

7. A semiconductor inspection apparatus comprising:
   a force probe applying voltage to a semiconductor device, the force probe having an end portion formed of a flat shape, the force probe end portion having a lower contact surface and an upper surface; and a sense probe detecting voltage of the semiconductor device, the sense probe having a distal end portion, wherein the lower surface of the force probe end portion is contacted with an electrode of the semiconductor device and upper surface of the force probe end portion is contacted by the distal end portion of the sense probe to measure electric characteristics of the semiconductor device.

8. The semiconductor inspection apparatus according to claim 7, wherein the force probe and the sense probe are arranged substantially on the same line when seen from a vertical direction with respect to an electrode surface of the semiconductor device with the sense probe being located vertically over the force probe.

9. The semiconductor inspection apparatus according to claim 7, wherein, the force probe extends in an oblique upward direction from the force probe end portion at a first angle with a principal surface of the semiconductor device, and bends at an area so that the force probe is substantially horizontal and parallel to the principal surface of the semiconductor device, and the sense probe end portion extending in an oblique upward direction with a second angle with the principal surface of the semiconductor device, the sense probe bending at an area so that the sense probe is substantially parallel to the principal surface of the semiconductor device from the sense probe end portion and the sense probe extends in a lateral direction of the semiconductor device, and the sense probe extends vertically over the force probe.

10. The semiconductor inspection apparatus according to claim 9, wherein, the sense probe end portion has a sharpened shape, the sharpened shape being in contact with the upper surface of the force probe.

11. The semiconductor inspection apparatus according to claim 7, wherein, the force probe and the sense probe are formed by a W material.

12. A semiconductor inspection apparatus comprising:

a force probe applying voltage to a semiconductor device; and a sense probe detecting voltage of the semiconductor device, wherein the force probe is contacted with an electrode of the semiconductor device and the force probe and the sense probe are contacted with each other to measure electric characteristics of the semiconductor device, an end portion of the force probe contacted with the electrode is formed in a sharp shape, the force probe includes a flat portion in the end portion side of the force probe, and an end portion of the sense probe is contacted with the flat portion of the force probe so that the sense probe and the force probe are contacted with each other.

13. The semiconductor inspection apparatus according to claim 12, wherein the force probe and the sense probe are arranged substantially on the same line when seen from a vertical direction with respect to an electrode surface of the semiconductor device.

14. The semiconductor inspection apparatus according to claim 12, wherein, the force probe and the sense probe are formed by a W material.

15. The semiconductor inspection apparatus according to claim 12, wherein, the force probe and the sense probe are formed by a Be—Cu material.

* * * * *